United States Patent
Kim et al.

(10) Patent No.: US 9,590,210 B2
(45) Date of Patent: Mar. 7, 2017

(54) METHOD OF EVALUATING IMAGE BLUR OF OPTICAL FILM AND OPTICAL FILM WITH REDUCED IMAGE BLUR

(71) Applicants: Samsung Electronics Co., Ltd, Suwon-si, Gyeonggi-do (KR); CHEIL INDUSTRIES INC., Gumi-si, Gyeongsangbuk-do (KR); Samsung Corning Precision Materials Co., Ltd., Gumi-si, Gyeongsangbuk-do (KR)

(72) Inventors: Hyunmin Kim, Uiwang-si (KR); Youmin Shin, Gyeongsangbuk-do (KR); Hongshik Shim, Seoul (KR); Young Oh, Uiwang-si (KR); Chulho Jeong, Hwaseong-si (KR); Eunyoung Cho, Gyeongsangbuk-do (KR)

(73) Assignees: SAMSUNG ELECTRONICS CO., LTD, Gyeonggi-Do (KR); CORNING PRECISION MATERIALS CO., LTD., Chungcheongnam-Do (KR); CHEIL INDUSTRIES INC., Gyeongsangbuk-Do (KR)

(*) Notice: Subject to any disclaimer, the term of this patent is extended or adjusted under 35 U.S.C. 154(b) by 4 days.

(21) Appl. No.: 14/513,393

(22) Filed: Oct. 14, 2014

(65) Prior Publication Data

US 2015/0103338 A1    Apr. 16, 2015

(30) Foreign Application Priority Data

Oct. 15, 2013  (KR) .......................... 10-2013-0122820

(51) Int. Cl.
*H01L 51/52*   (2006.01)
*G02B 5/02*    (2006.01)

(52) U.S. Cl.
CPC .......... *H01L 51/5275* (2013.01); *G02B 5/021* (2013.01); *G02B 5/0278* (2013.01); *G02B 5/0294* (2013.01); *H01L 51/5265* (2013.01)

(58) Field of Classification Search
CPC .................................................... H01L 51/5275
(Continued)

(56) References Cited

U.S. PATENT DOCUMENTS

2008/0294012 A1* 11/2008 Kurtz ................... A61B 5/0059
                                                      600/300
2009/0148691 A1*  6/2009 Lee .......................... G02B 1/111
                                                      428/328
(Continued)

FOREIGN PATENT DOCUMENTS

JP        07282247 A     10/1995
JP       2004191611 B2    7/2004
(Continued)

OTHER PUBLICATIONS

Hirai, et al., Correlation Analysis between Motion Blur Widths and Human Perception, IDW, vol. 62, No. 10, (2008) pp. 1580-1587.
(Continued)

*Primary Examiner* — Tarifur Chowdhury
*Assistant Examiner* — Omar Nixon
(74) *Attorney, Agent, or Firm* — Cantor Colburn LLP

(57) ABSTRACT

A method of evaluating an image blur of an optical film includes displaying a test pattern by driving an organic light-emitting display apparatus including the optical film, obtaining an image by capturing the test pattern using a digital camera, obtaining a spatial luminance distribution from the image, transforming the spatial luminance distribution into a sensation curve, and estimating a blur width from the sensation curve, where the blur width is a distance
(Continued)

between peaks having negative minimum values, from among a plurality of peaks of the sensation curve.

19 Claims, 16 Drawing Sheets

(58) Field of Classification Search
 USPC ........................................................ 356/237.1
 See application file for complete search history.

(56) References Cited

U.S. PATENT DOCUMENTS

| | | | | |
|---|---|---|---|---|
| 2010/0102315 | A1* | 4/2010 | Suzawa | H01L 27/1225 257/43 |
| 2010/0245722 | A1* | 9/2010 | Yoneyama | G02B 5/02 349/84 |
| 2011/0277361 | A1* | 11/2011 | Nichol | G02B 6/0018 40/541 |
| 2012/0182506 | A1* | 7/2012 | Park | G02B 3/005 349/112 |
| 2012/0218301 | A1* | 8/2012 | Miller | G02B 27/017 345/633 |

FOREIGN PATENT DOCUMENTS

| | | |
|---|---|---|
| KR | 1020080046427 A | 5/2008 |
| KR | 1020110043246 A | 4/2011 |
| KR | 1020110126691 A | 11/2011 |
| KR | 1020140081653 A | 7/2014 |
| KR | 1020140141351 A | 12/2014 |
| WO | 03092306 A1 | 11/2003 |

OTHER PUBLICATIONS

Ho, et al., Luminance Enhancement and Blur Effect of Microlens Array Film Attachment on Organic Light-Emitting Device, 0-7803-9556-5/06/$20.00 (2006) IEEE, p. 713-714.

Oka, et al., Edge Blur Width Analysis Using a Contrast Sensitivity Function, SID (2006) Digest, 3.3/K. Oka, pp. 10-13.

Peter G. J. Barten, Contrast Sensitivity of the Human Eye and Its Effects on Image Quality, SPIE Optical Engineering Press, Chapter 3, Model for the spatial contrast sensitivity of the eye, Dec. 1, 1999, pp. 27-40.

* cited by examiner

__METHOD OF EVALUATING IMAGE BLUR OF OPTICAL FILM AND OPTICAL FILM WITH REDUCED IMAGE BLUR__

RELATED APPLICATION

This application claims priority to Korean Patent Application No. 10-2013-0122820, filed on Oct. 15, 2013, and all the benefits accruing therefrom under 35 U.S.C. §119, the content of which in its entirety is herein incorporated by reference.

BACKGROUND

1. Field

The disclosure relates to a method of evaluating image blur of an optical film, an optical film for reducing color shift with reduced image blur and an organic light-emitting display apparatus including the optical film.

2. Description of the Related Art

An organic light-emitting diode ("OLED") typically includes an anode, an organic emission layer and a cathode. In such an OLED, when a voltage is applied between the anode and the cathode, holes are injected from the anode to the organic emission layer, and electrodes are injected from the cathode to the organic emission layer. The holes and electrons injected into the organic emission layer recombine in the organic emission layer and generate excitons, and light is generated as the excitons transfer from an excited state to a ground state.

In the OLED, since a light-emitting material is an organic material, a problem of reduced lifespan due to deterioration is a critical issue in the development of OLED technology. Thus, many technologies are being developed to solve the problem.

One of the technologies is to use a micro cavity structure that resonates light having a certain wavelength to increase an intensity of the light, and emits the light to the outside. That is, a distance between an anode and a cathode is designed to match a representative wavelength of each of red, green and blue, and thus, only light corresponding thereto is resonated to be emitted to the outside, and the other light is weakened. As a result, an intensity of the light emitted to the outside is strengthened and sharpened, thereby increasing luminance and color purity thereof. Furthermore, the increase of luminance may lead to low power consumption, thereby increasing lifespan of the OLED.

SUMMARY

In an organic light-emitting diode ("OLED") having a micro cavity structure, wavelengths to be amplified are determined based on the thickness of an organic deposition material layer. Here, a length of a light path changes at a lateral side, thereby causing an effect similar to a change of thickness of an organic deposition material layer. Therefore, the wavelengths to be amplified are changed.

According, in such an OLED, as the viewing angle is tilted from the front to a lateral side, the maximum resolution wavelength becomes shorter, and thus color shift occurs as the maximum resolution wavelength decreases. For example, even if white color is embodied at the front, the white color may become bluish at a lateral side due to blue shift phenomenon.

In such an OLED, an optical film for reducing color shift, which may reduce an amount of color shift based on viewing angles and maintain high luminance in the center, may be provided to overcome problems due to the color shift. As such optical film, a high refractive index pattern layer and a low refractive index pattern layer may be attached to form a lens pattern to reduce an amount of white angle dependency ("WAD") changes according to viewing angles.

However, the OLED typically includes multiple pixel units that emit light, light emitted from a pixel may spread to adjacent pixels due the optical film. Therefore, image blur may occur.

Provided are embodiments of a method of evaluating image blur of an optical film, an optical film for reducing color shift and an organic light-emitting display apparatus including the optical film and with reduced image blur.

According to an embodiment of the invention, a method of evaluating image blur of an optical film includes: displaying a test pattern by driving an organic light-emitting display apparatus including the optical film; obtaining an image by capturing the test pattern using a digital camera; obtaining a spatial luminance distribution from the image; transforming the spatial luminance distribution into a sensation curve; and estimating a blur width from the sensation curve, in which the blur width is a distance between peaks having minimum negative values, from among a plurality of peaks of the sensation curve.

In an embodiment, an x-axis of the sensation curve may represent distance and a y-axis of the sensation curve may represent sensation, the plurality of peaks of the sensation curve may include a plurality of peaks in x-y coordinates. In such an embodiment, the blur width may be a distance between two peaks having minimum negative y-coordinate values, from among peaks of the sensation curve in a region where the x-coordinates are negative and a region where the x-coordinates are positive.

In an embodiment, the test pattern may be displayed on the optical film by a plurality of pixels disposed along a scanning line of a panel of the organic light-emitting display apparatus.

In an embodiment, the digital camera may include a charge coupled device ("CCD") of the digital camera having a predetermined resolution which allows 30 or more CCD pixels to cover one pixel of the organic light-emitting display apparatus.

In an embodiment, the spatial luminance distribution may be estimated using a spectro-radiometer.

In an embodiment, the spatial luminance distribution may be transformed into the sensation curve using a Fourier transform and a numerical computation program.

In an embodiment, the spatial luminance distribution may be transformed into a spatial frequency function using the Fourier transform, and may be transformed into the sensation curve by multiplying a color sensitivity function ("CSF") by the spatial frequency function and using an inverse Fourier transform.

In an embodiment, the optical film may be an optical film for reducing color shift.

In an embodiment, the optical film may include a base layer, a high refractive optical diffusion layer disposed on the base layer, a high refractive resin layer disposed on the high refractive optical diffusion layer, and a low refractive resin layer disposed on the high refractive resin layer, where an optical pattern is defined in the low refractive resin layer.

According to another embodiment of the invention, an optical film includes: a high refractive index pattern layer including a material having a refractive index greater than about 1, in which a first surface of the high refractive index pattern layer includes a pattern corresponding to a plurality of grooves, each having a curved groove surface, and each of the plurality of grooves has a depth greater than a width thereof; and a low refractive index pattern layer including a material having a refractive index less than the refractive index of the high refractive index pattern layer, where the low refractive index pattern layer includes protrusions corresponding to the plurality of grooves, where the optical film satisfies the following condition:

$$\frac{L_B - L_{B,0}}{L_{B,0}} \langle 0.7.$$

In an embodiment, each of the plurality of grooves may have a stripe shape which extends in a predetermined direction, and the plurality of grooves may be 1-dimensionally arranged.

In an embodiment, the material of the high refractive index pattern layer or the material of the low refractive index pattern layer may include a transparent resin material and a light diffuser.

In an embodiment, a lens pattern area, in which the plurality of grooves is defined, and a non-pattern area may be alternately disposed in the optical film.

In an embodiment, a width of the lens pattern area may be greater than a width of the non-pattern area.

In an embodiment, each of the plurality of grooves may have a dot shape and the plurality of grooves may be 2-dimensionally arranged.

In an embodiment, each of the plurality of grooves may have an oval shape.

In an embodiment, the plurality of grooves may be arranged without intervals in a first direction and may be spaced apart from each other at predetermined intervals in a second direction, which is perpendicular to the first direction.

In an embodiment, the protrusions may include a plurality of layers having different refractive indexes from each other.

In an embodiment, the optical film may further include an anti-reflection layer disposed on the second surface of the high refractive index pattern layer, and a circular polarization film or a transmittance adjusting layer disposed between the high refractive index pattern layer and the anti-reflection layer.

According to another embodiment of the invention, an organic light-emitting display apparatus includes: an organic light-emitting display panel including a plurality of pixels including organic emission layers, each of which emits light of different wavelengths, where each of the plurality of pixels has a micro cavity structure configured to resonate light corresponding to one of the different wavelengths; and any one of the above-described optical film disposed on the organic light-emitting display panel.

BRIEF DESCRIPTION OF THE DRAWINGS

These and/or other features of the invention will become apparent and more readily appreciated from the following description of embodiments, taken in conjunction with the accompanying drawings, in which.

DETAILED DESCRIPTION

Figure 1A:
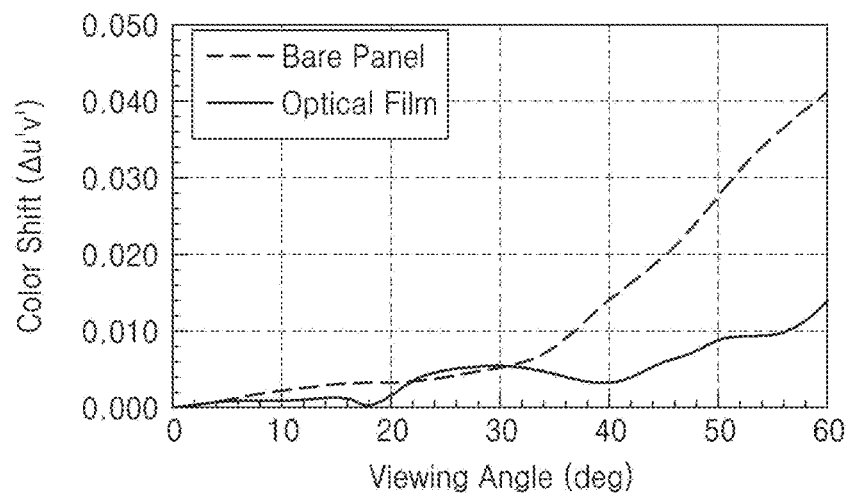
FIG. 1A is a graph showing color shift based on viewing angle in a display panel including an embodiment of an optical film for reducing color shift and in a display panel without the optical film (bare panel)

The invention will now be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an embodiment of a method of evaluating an image blur of an optical film in detail.

An optical film for reducing color shift may means an optical film that reduces white angle dependency ("WAD") changes according to viewing angles, and thus allows the WAD according to the viewing angles to be substantially uniform. However, in an organic light-emitting display apparatus, which typically includes a plurality of pixels, light emitted from a pixel may spread to adjacent pixels, and therefore, an image blur may occur. The image blur refers to a phenomenon where pixels are not clearly but hazily observed by a viewer.

Figure 1B:
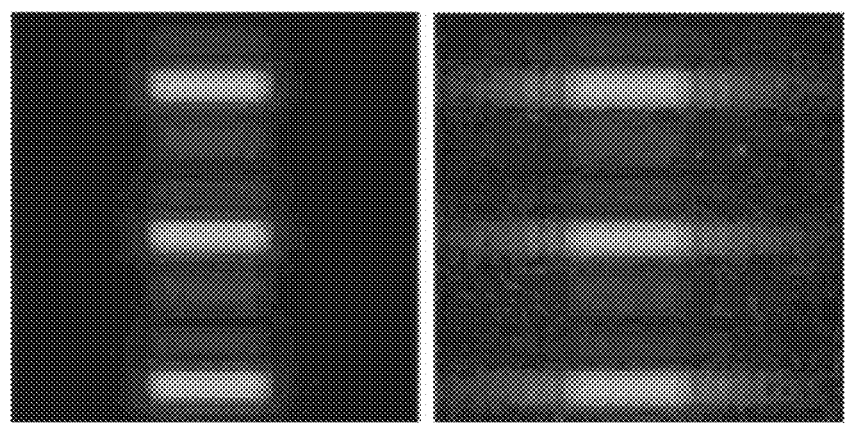
FIG. 1B is exemplary view showing image blur in a display panel including the optical film and in a bare panel.

FIG. 1A is a graph showing color shift based on viewing angle in a display panel including an optical film for reducing color shift and in a display panel without such an optical film (hereinafter, will be referred to as a "bare panel"), and FIG. 1B is exemplary view of image blur in a display panel including the optical film and in a bare panel. Referring to FIG. 1A, the rate (Δu'v') of color shift based on the viewing angles is lower in a display panel including the optical film for reducing color shift than in the bare panel. However, as shown in FIG. 1B, the image blur may occur when the display panel includes the optical film for reducing color shift.

Embodiment described herein may provide a method of objectively evaluating image blur in an optical film, more particularly, image blur in the optical film for reducing color shift, by quantifying the image blur.

In an embodiment of the invention, the method of evaluating the image blur of the optical film may include displaying a test pattern by driving an organic light-emitting display apparatus including the optical film, obtaining an image by capturing the test pattern using a digital camera, obtaining a spatial luminance distribution, obtaining a sensation curve by transforming the spatial luminance distribution, and estimating a blur width from the sensation curve. An embodiment of the method will hereinafter be described in greater detail with reference to FIGS. 2 and 3.

Figure 2:
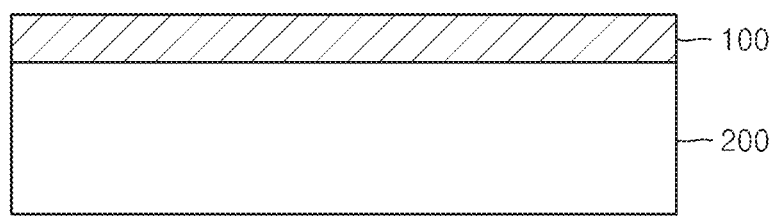
FIG. 2 is a cross-sectional view of an embodiment of an organic light-emitting display apparatus including an optical film for evaluating the image blur.
Figure 3:
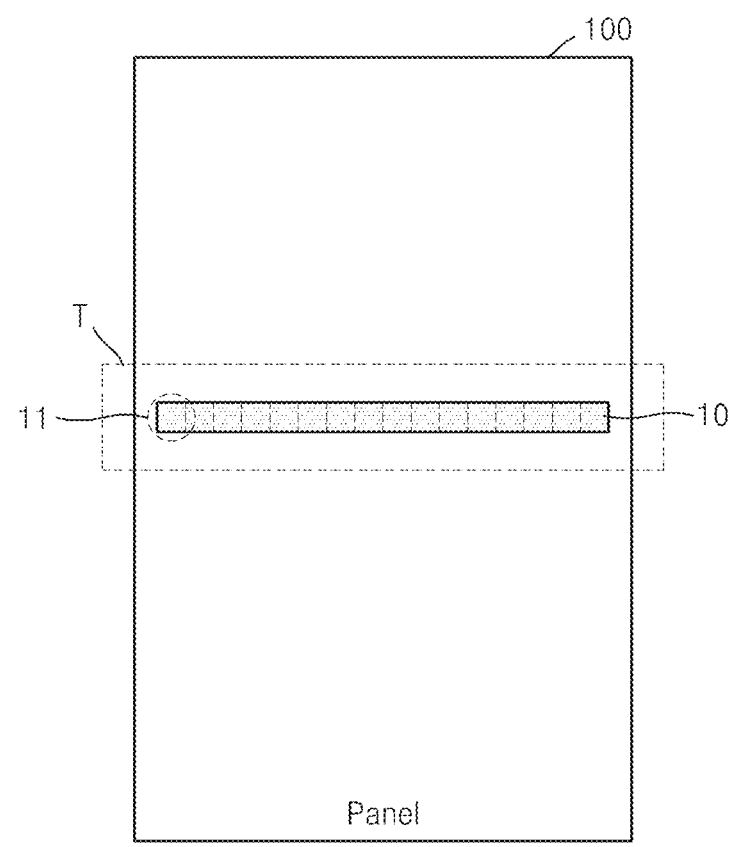
FIG. 3 illustrates a test pattern shown as a scanning line of a panel on the optical film.

FIG. 2 is a cross-sectional view of an embodiment of an organic light-emitting display apparatus 200 including an optical film 100 for evaluating the image blur. FIG. 3 illustrates an embodiment of a test pattern for detecting image blur, displayed on the optical film 100 along a scanning line 10 of a panel of the organic light-emitting display apparatus 200. The scanning line 10 may correspond to a plurality of pixels 11 sequentially disposed along a line in a predetermined direction.

In an embodiment, a test pattern of the panel is displayed on the optical film 100 as shown in FIG. 3 by driving the organic light-emitting display apparatus 200 including the optical film 100 of FIG. 2.

In such an embodiment, an image is obtained by capturing a test pattern using the digital camera. The digital camera may include a charge coupled device ("CCD"), and may have a predetermined resolution which allows 30 or more CCD pixels to cover each pixel 11 in the scanning line 10 on the organic light-emitting display apparatus 200.

In such an embodiment, a relative spatial luminance distribution is obtained from the image obtained by capturing the test pattern. Then, the relative spatial luminance distribution is estimated or approximately calculated using a spectro-radiometer to obtain a front absolute luminance value. An actual spatial luminance distribution may be obtained from the relative spatial luminance distribution and the front absolute luminance value.

In such an embodiment, the actual spatial luminance distribution obtained from the relative spatial luminance distribution and the front absolute luminance value may be transformed into a sensation curve using Fourier transform and a numerical computation program. In one embodiment, for example, the actual spatial luminance distribution is transformed into a spatial frequency function using Fourier transform, and the sensation curve may be obtained by multiplying a color sensitivity function ("CSF") by the spatial frequency function and then applying an inverse Fourier transform to the product thereof.

The Fourier transform may be fast Fourier transform ("FFT") and may be conducted using a numerical computation program such as Mathematica® or Matlab®.

In such an embodiment of the method of evaluating the image blur according to the invention, the image blur may be quantified based on parameters defined by a distance blur width as measured based on the sensation curve.

According to an embodiment, the blur width may be defined as a distance between peaks having the minimum negative values from among a plurality of peaks of the sensation curve.

Figure 4:
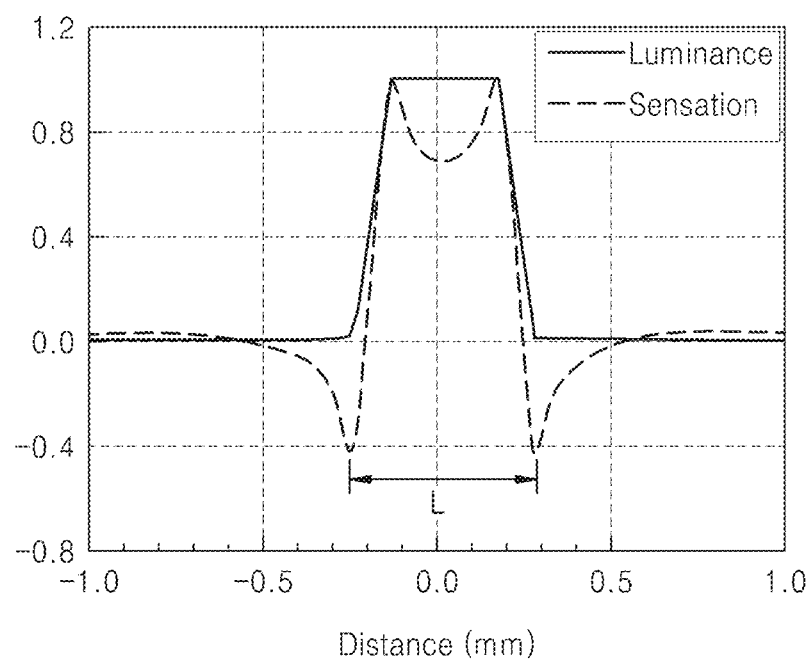
FIG. 4 is a graph showing a luminance curve and a sensation curve for defining a blur width used in an embodiment of a method of evaluating the image blur, according to the invention.

FIG. 4 is a graph showing a luminance curve and a sensation curve for defining a blur width used in an embodiment of the method of evaluating the image blur according to the invention.

In the graph of FIG. 4, the x-axis represents distance and the y-axis represents sensation, the sensation curve includes a plurality of peaks according to x-coordinates and y-coordinates of the sensation curve. The blur width may be defined as a distance L between two peaks on the sensation curve, i.e., a peak having minimum negative y-coordinate value in a region where the x-coordinates are negative and a peak having minimum negative y-coordinate value in a region where the x-coordinates are positive. In a sensation curve where there are more than two peaks having a negative y-coordinate, the blur width may be calculated by estimating the distance L between peaks having minimum negative y-coordinate values from among peaks having negative y-coordinate values.

In an embodiment, the optical film used for evaluating the image blur may be an optical film for reducing color shift. An embodiment of the optical film may include a base layer, a high refractive optical diffusion layer, a high refractive resin layer, and a low refractive resin layer including an optical pattern formed or defined thereon, which are sequentially disposed one on another. In such an embodiment, the high refractive optical diffusion layer may include a light diffuser, and the optical pattern may be a micro lens pattern or a lenticular lens pattern, for example.

Figure 5:
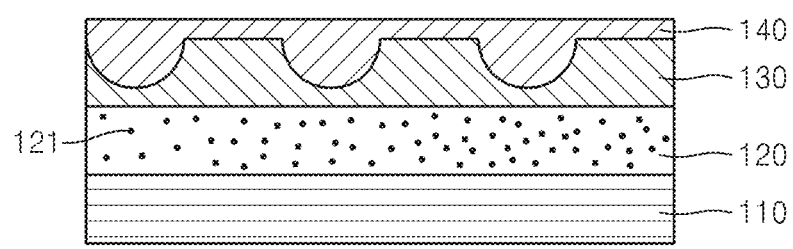
FIG. 5 is a cross-sectional view of an embodiment of the optical film for evaluating the image blur.
Figure 6:
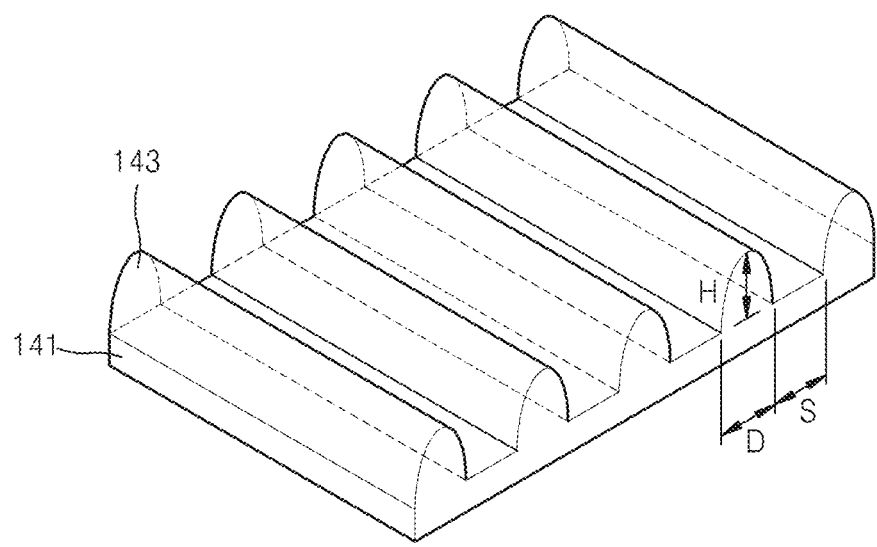
FIG. 6 is a detailed perspective view of a lenticular lens pattern in the optical film of FIG. 5.

FIG. 5 is a cross-sectional view of an embodiment of the optical film for evaluating the image blur. FIG. 6 is a perspective view of a lenticular lens pattern in the optical film of FIG. 5.

Referring to FIG. 5, in an embodiment of the optical film for reducing color shift, a base layer 110, a high refractive optical diffusion layer 120 including a light diffuser 121, a high refractive resin layer 130, and a low refractive resin layer 140 including a lenticular lens pattern are sequentially disposed, e.g., stacked, one on another. The lenticular lens pattern may include a structure at a surface of the low refractive resin layer 140 which faces the high refractive resin layer 130.

Referring to FIG. 6, the lenticular lens pattern may be provided or formed by disposing a plurality of lenticular lenses 143 on a low refractive resin layer 141 with intervals S, e.g., predetermined constant intervals. In an embodiment, where the plurality of lenticular lenses 143 are disposed at the intervals S as described above, although color shift based on the viewing angles may be improved, image blur may occur.

An embodiment of the method of evaluating the image blur according to the invention may be used to improve color shift and reduce image blur.

Hereinafter, elements and features of an embodiment of a method of evaluating the image blur according to the invention will be described in more detail with reference to various embodiments of a display panel including an optical film, but are not limited to such embodiments in any sense.

The technical elements and features that may be understood by one of ordinary skill in the art will be omitted.

Figure 7:
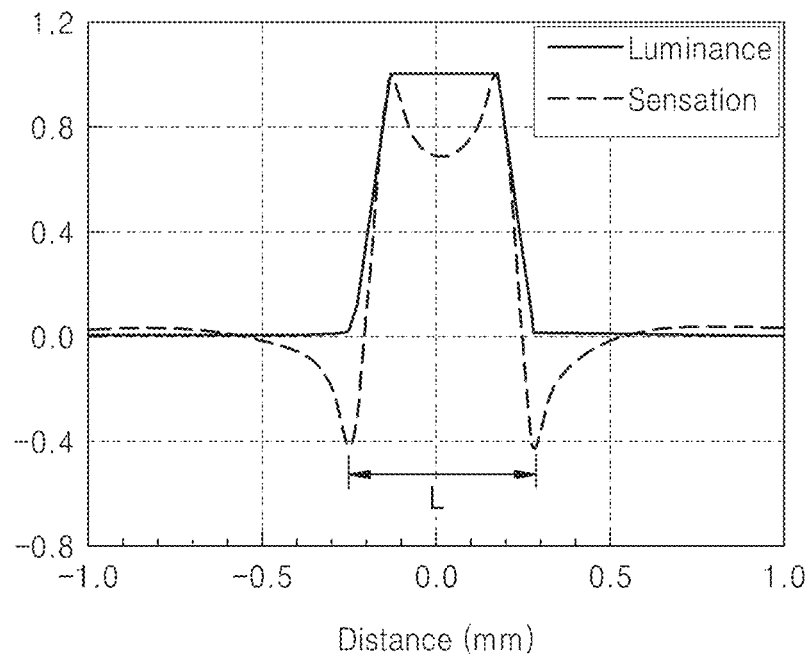
FIG. 7 is a view of a sensation curve obtained from an first embodiment of the optical film.
Figure 10:
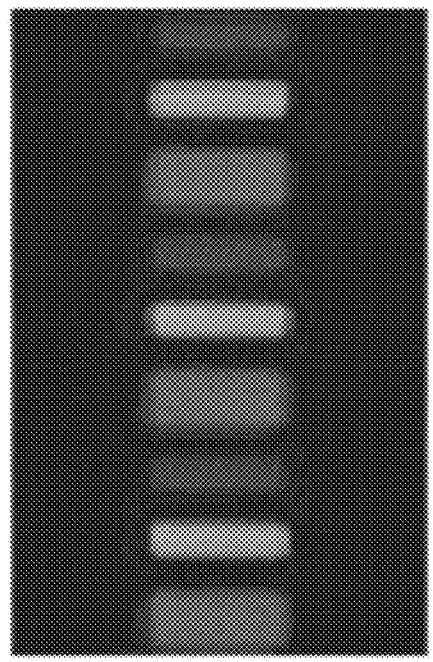
FIG. 10 is an image of a test pattern of the first embodiment captured using a digital camera.

In an embodiment, a base film (a triacetyl cellulose ("TAC") film of Fujifilm Co.) having a thickness of about 60 micrometers (μm) is provided in the organic light-emitting display apparatus (hereinafter, first embodiment). Then, according to a method described above, a sensation curve was obtained and a blur width was estimated, the results of which are shown in Table 1 below. FIG. 7 is a view of the sensation curve of the first embodiment, and FIG. 10 is an image of a test pattern of the first embodiment captured using a digital camera (NX20 of Samsung Electronics Co., Ltd.).

Figure 8:
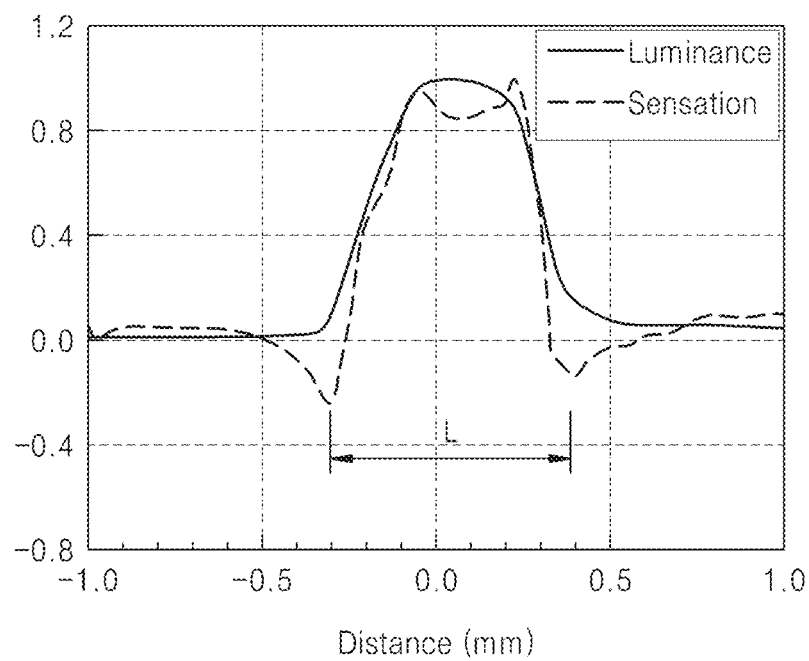
FIG. 8 is a view of a sensation curve obtained in a second embodiment of the optical film.
Figure 11:
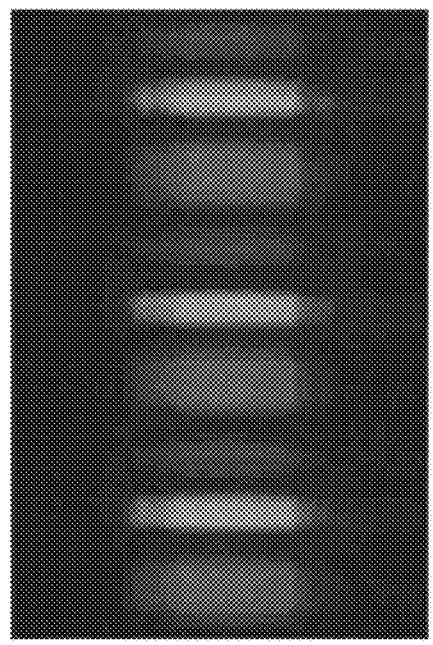
FIG. 11 is an image of a test pattern of the second embodiment captured using the digital camera.

In another embodiment, the optical film of FIG. 5 for reducing color, in which layers described above with reference to FIG. 5 are sequentially stacked one on another, is provided in the organic light-emitting display apparatus (hereinafter, a second embodiment). Then, according to the method described above, a sensation curve was obtained and a blur width was estimated, the results of which are shown in Table 1 below. FIG. 8 is a view of the sensation curve of the second embodiment, and FIG. 11 is an image of a test pattern of the second embodiment captured using the digital camera (NX20 of Samsung Electronics Co., Ltd.).

In the second embodiment, the TAC film of Fujifilm Co. is used as the base layer, and a thickness thereof is about 60 μm.

In the second embodiment, the high refractive optical diffusion layer is an organic light diffuser which is manufactured using an ultraviolet ("UV") curable transparent acryl-based resin (RS1400 of Aekyung Chemical Co., Ltd.), throughout which about 0.5 wt % of non-coated silicon-based particles (SL-200 of Cheil Industries Inc.) and about 0.5 wt % of acryl-based particles coated with a black pigment (xx-2740Z of Sekisui Chemical Co., Ltd.) are dispersed. The high refractive optical diffusion layer has a refractive index of about 1.528 and a thickness of about 40 μm.

In the second embodiment, the high refractive resin layer is a transparent acryl-based UV curing resin, and has a refractive index of about 1.4 and a maximum thickness of about 40 μm.

In the second embodiment, an optical pattern is defined or formed in the low refractive resin layer. The low refractive resin layer is formed using transparent acryl-based UV curing resin having a refractive index as shown in Table 1. A plurality of half-circular lenticular lenses is sequentially arrayed at intervals of about 18 μm on a surface of the low refractive resin layer. The low refractive resin layer and lenticular lenses are integrally formed. The low refractive resin layer has a thickness of about 17 μm, and the lenticular lenses each have a width D of about 10 μm, a height H of about 12 μm, and an aspect ratio (H/D) of about 1.2.

Figure 9:
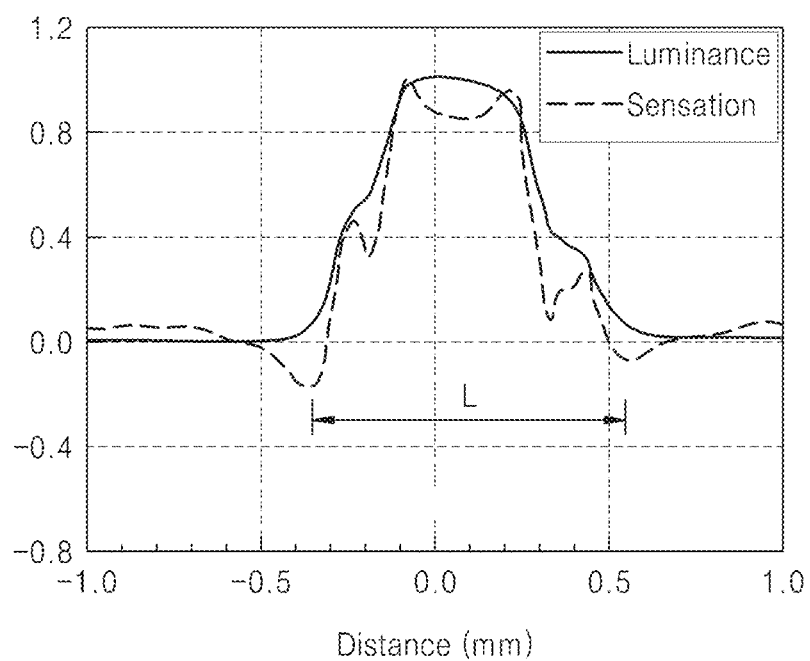
FIG. 9 is a view of a sensation curve obtained in a third embodiment of the optical film.
Figure 12:
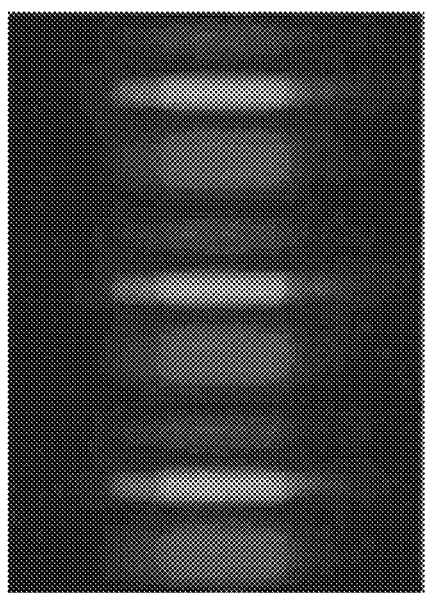
FIG. 12 is an image of a test pattern of the third embodiment captured using the digital camera.

Another optical film for reducing color shift, which is manufactured in substantially the same method as the second embodiment except that a high refractive optical diffusion layer included in the optical film does not include a light diffuser, is provided in the organic light-emitting display apparatus (hereinafter, a third embodiment). Then, according to the method described above, a sensation curve was obtained and a blur width was estimated, the results of which are shown in Table 1 below. FIG. 9 is a view of the sensation curve of the third embodiment, and FIG. 12 is an image of a test pattern of the third embodiment captured using the digital camera (NX20 of Samsung Electronics Co., Ltd.).

Hereinafter, an embodiment of the method of evaluating the Image blur will be described in greater detail.

The organic light-emitting display apparatus including the optical film according to the first to third embodiments is driven to display the test pattern shown as the scanning line of the panel on the optical film. Then, the image is obtained by capturing the test pattern using the digital camera. The relative spatial luminance distribution is obtained from the image using Origin, which is an image-luminance conversion program. Then, the absolute luminance value of the front is obtained using a spectro-radiometer (SR-UL2-CAL of Topcon Co.) to thus obtain the actual spatial luminance value.

The spatial luminance value is fast Fourier transformed to obtain the spatial frequency function. Then, the CSF, which reflects visual characteristics of a spatial frequency, is multiplied by the spatial frequency function to obtain a sensation curve of spatial frequency. Next, the sensation curve is inverse Fourier transformed into a spatial function. Finally, a distance between left and right peaks on the sensation curve which have the minimum negative y-coordinate values from among peaks having negative y-coordinate values is calculated to thus estimate the blur width.

TABLE 1

|  | First Embodiment | Second Embodiment | Third Embodiment |
|---|---|---|---|
| Refractive Index Difference |  | 0.128 | 0.128 |
| Aspect Ratio of Lenticular Lens |  | 1.2 | 1.2 |
| Light Diffuser Included | X | ○ | X |
| Blur Width (μm) | 531.5 | 709.33 | 917.44 |

Referring to Table 1 and FIGS. 7 to 12, it may be understood that as the blur width increases, the amount of image blur increases. Since the blur width is a parameter that reflects visual characteristics of the optical film for reducing color shift related to the image blur, in an embodiment, an actual degree of image blur that is sensed by eye may be effectively quantified.

In one embodiment, for example, a blur width ratio ("BWR") is defined by comparing an organic light-emitting display panel that does not include the optical film for reducing color shift and an organic light-emitting display panel that includes the optical film for reducing color shift as in the following Equation 1, $$BWR(\%) = \frac{L_B - L_{B,0}}{L_{B,0}} \times 100 \qquad (1)$$

In Equation 1, $L_B$ denotes a blur width of the organic light-emitting display panel including the optical film for reducing color shift, and $L_{B,0}$ denotes the blur width of the organic light-emitting display panel not including the optical film for reducing color shift.

Regarding both a color shift improvement rate and the BWR, various design variables of the optical film for reducing color shift may be determined. In general, the color shift improvement rate may be calculated by comparing a color shift (Δu'v') at a 60° viewing angle with respect to front white (x,y)=(0.28,0.29). The optical film for reducing color shift may be designed to allow the BWR to be less than about 70%, and the color shift improvement rate to be maintained at about 35% or higher.

As described above, an embodiment of the method of evaluating the image blur, which is quantified in terms of visual characteristics, is provided. According to the method, a structure of the optical film for reducing color shift with reduced image blur may be determined.

Hereinafter, various embodiments of the optical film which satisfy the above-described conditions will be described. In such embodiments, the optical film is designed to maintain a color shift improvement rate of at least about 35%, and elements that affect improvement of the image blur when the color shift improvement rate of at least about 35% is maintained will be described.

Figure 13:
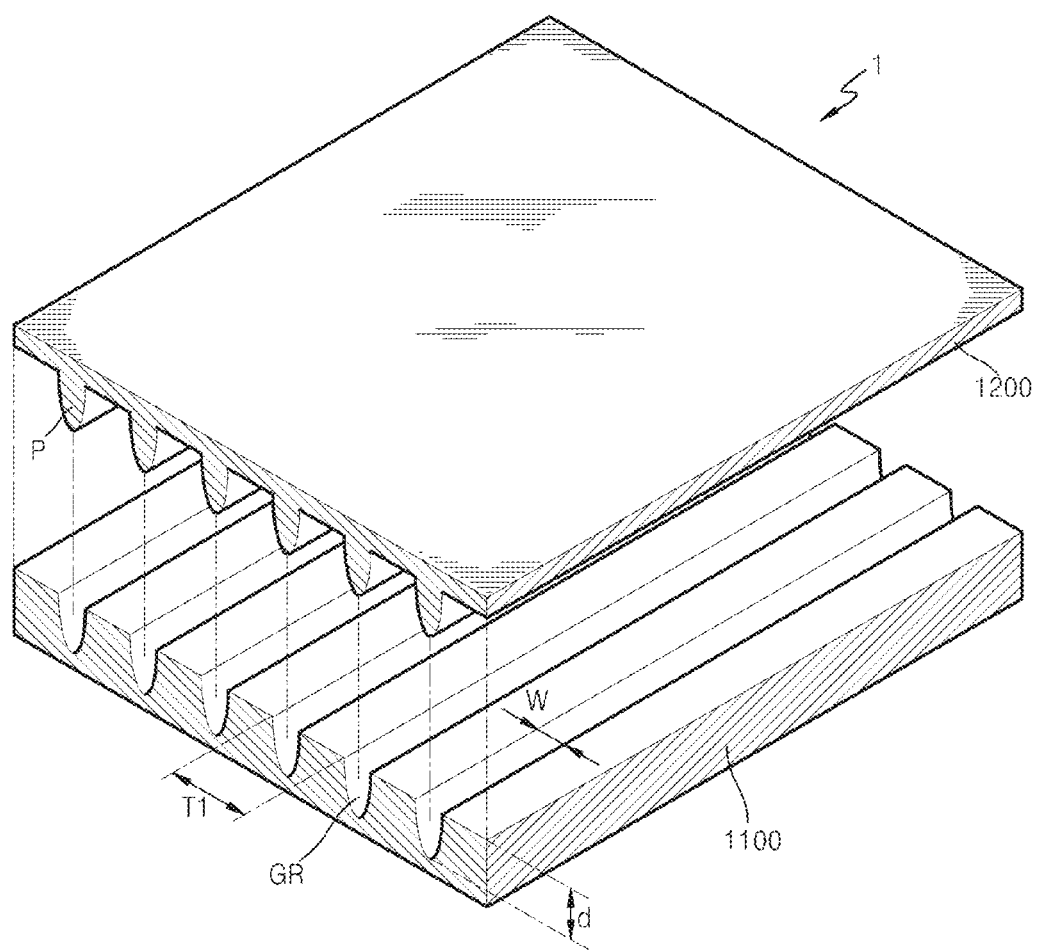
FIG. 13 is an exploded perspective view of an embodiment of the optical film according to the invention.

FIG. 13 is an exploded perspective view of an embodiment of an optical film 1 according to the invention.

The optical film 1 includes a high refractive index pattern layer 1100 that includes a material having a refractive index greater than about 1 and further includes a plurality of grooves GR, each defined by an engraved pattern of which a depth is greater than a width; and a low refractive index pattern layer 1200 that includes a material having a refractive index less than the refractive index of the material of the high refractive index pattern layer 1100 and further includes protrusions P that correspond to the plurality of grooves GR.

The optical film 1 may satisfy a predetermined condition, e.g., an inequality below.

$$\frac{L_B - L_{B,0}}{L_{B,0}} < 0.7$$

In the inequality above, $L_B$ denotes a blur width of an organic light-emitting display panel including the optical film 1, and $L_{B,0}$ denotes a blur width of an organic light-emitting display panel not including the optical film, which are evaluated by the method described above.

The plurality of grooves GR may be provided or formed to have a stripe shape that extends in a predetermined direction and be 1-dimensionally arranged at predetermined intervals T1.

The aspect ratio, i.e., a ratio of a width "w" of a groove to a depth "d" of the groove, a difference Δn between a refractive index of the high refractive index pattern layer 1100 and a refractive index of the low refractive index pattern layer 1200, and the intervals T1 between the grooves GR are design variables that affect the color shift correction rate of the optical film 1 and the BWR defined by Equation 1. In one embodiment, for example, a large aspect ratio may be effective for reducing color shift, but may cause manufacturing difficulty and increase image blur. Table 2 is a computer simulation result showing BWRs corresponding to various values of the design variables.

TABLE 2

|  | Aspect Ratio | Δn | BWR(%) |
| --- | --- | --- | --- |
| Case 1-1 | 1.56 | 0.12 | 71.8 |
| Case 1-2 | 1.56 | 0.14 | 70.1 |
| Case 1-3 | 1.56 | 0.16 | 69.1 |
| Case 1-4 | 1.78 | 0.12 | 69.9 |
| Case 1-5 | 1.78 | 0.14 | 67.6 |
| Case 1-6 | 1.78 | 0.16 | 73.9 |
| Case 1-7 | 2 | 0.12 | 71.9 |
| Case 1-8 | 2 | 0.14 | 68 |
| Case 1-9 | 2 | 0.16 | 68.8 |
| Case 1-10 | 2.22 | 0.12 | 65.3 |
| Case 1-11 | 2.22 | 0.14 | 66.6 |
| Case 1-12 | 2.22 | 0.16 | 66.2 |

In all of the cases above, a pattern occupying ratio is set to be about 35% and a color shift improvement rate is set to be about 35%. From the computer simulation result, it may be understood that an appropriate aspect ratio and the difference Δn between the refractive index of the high refractive index pattern layer 1100 and the refractive index of the low refractive index pattern layer 1200 may be determined for a stripe pattern in an optical film having the stripe pattern by considering an image blur and the color correction rate.

Figure 14:
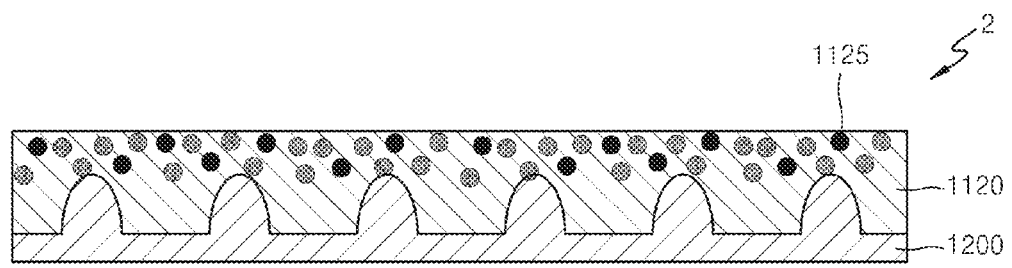
FIGS. 14 and 15 are cross-sectional views of embodiments of an optical film including an light diffuser, according to the invention.

FIG. 14 is a cross-sectional view of an embodiment of an optical film 2 including a light diffuser 1125, according to the invention.

The optical film 2 includes a high refractive index pattern layer 1120, which includes a transparent resin material and a light diffuser 1125, and the low refractive index pattern layer 1200.

The light diffuser 1125 may include diffusive beads, a silicon-based diffuser and/or an acryl-based diffuser, for example. In such an embodiment, the light diffuser 1125 increases visual characteristics by planarizing a peak that may occur in color shift (Δu'v') and luminance profiles with respect to viewing angles. In such an embodiment, a content of the light diffuser 1125 may affect a degree of image blur.

Table 3 is a computer simulation result of BWRs according to the content of the light diffuser 1125.

TABLE 3

|  | Aspect Ratio | Δn | Content (wt %) | BWR(%) |
| --- | --- | --- | --- | --- |
| Case 2-1 | 2.4 | 0.16 | 0 | 78.4 |
| Case2-2 | 2.4 | 0.16 | 1 | 62.5 |
| Case2-3 | 2.4 | 0.16 | 0.5 | 31.5 |

The computer simulation result shows that an optical film with reduced image blur may be prepared by providing the content of the light diffuser 1125 in the optical film to be about 1 wt % or less, thus planarizing peaks that may occur in color shift or the luminance profiles.

In an embodiment, as described above, a light diffuser may be included in a high refractive index pattern layer, but not being limited thereto. In an alternative embodiment, the light diffuser may be included in a low refractive index pattern layer.

Figure 15:
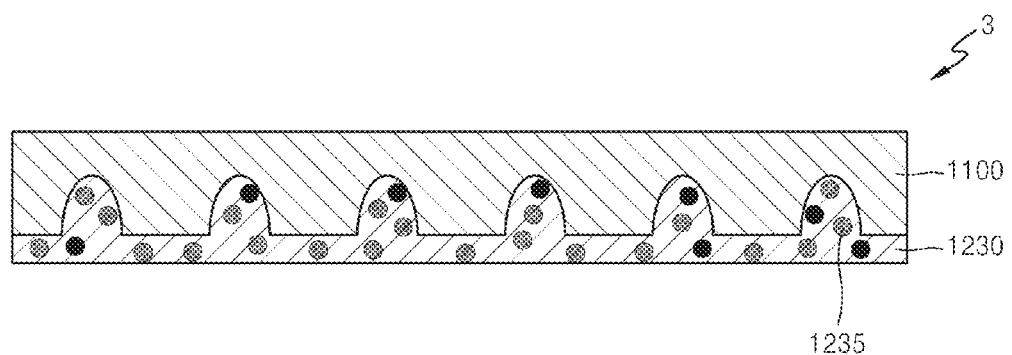

FIG. 15 is a cross-sectional view of an alternative embodiment of an optical film 3 including a light diffuser 1235, according to the invention.

The optical film 3 includes a high refractive index pattern layer 1100 and a low refractive index pattern layer 1230, which includes a transparent resin material and a light diffuser 1235.

Figure 16:
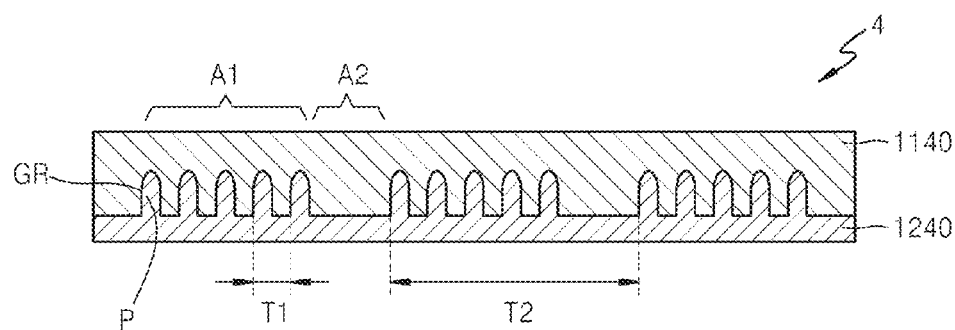
FIG. 16 is a cross-sectional view of an alternative embodiment of an optical film according to the invention.
Figure 17:
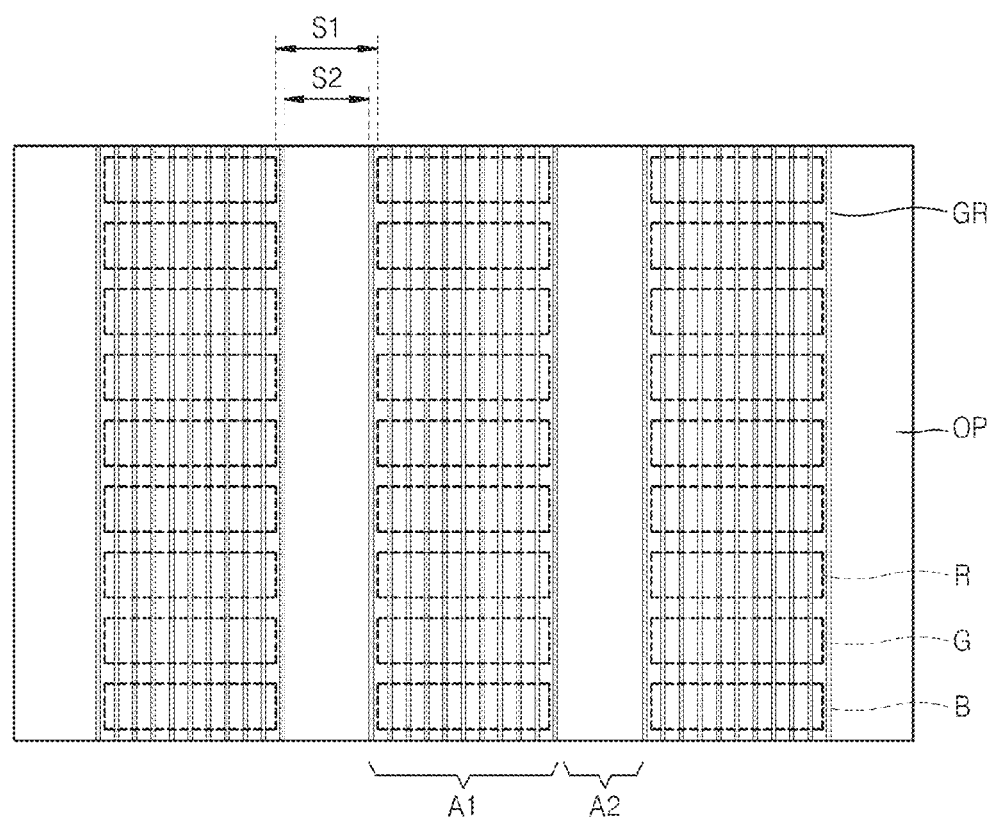
FIG. 17 is a plan view showing an arrangement relationship between the optical film of FIG. 16 and pixels of an embodiment of an organic light-emitting display panel including the optical film.

FIG. 16 is a cross-sectional view of an alternative embodiment of an optical film 4 according to the invention. FIG. 17 is a plan view of an arrangement relationship between the optical film 4 of FIG. 16 and pixels of an embodiment of an organic light-emitting display panel OP.

In an embodiment, the optical film 4 includes a high refractive index pattern layer 1140 including a lens pattern area A1 and a non-pattern area A2 that are alternately disposed with each other. In such an embodiment, the lens pattern area A1 includes a plurality of grooves GR which have a depth greater than a width thereof and are engraved therein, and a low refractive index pattern layer 1240 including a material having a refractive index less than that of the high refractive index pattern layer 1140, where the low refractive index pattern layer 1240 includes protrusions P that correspond to the plurality of grooves GR.

The lens pattern area A1 is an area for reducing color shift based on viewing angles by combining light incident from various incident angles. The plurality of grooves GR are alternately disposed at predetermined intervals T1 in the lens pattern area A1. The non-pattern area A2 is an area for reducing image distortion that may occur due to the lens pattern area A1. The lens pattern area A1 and the non-pattern area A2 may be alternately with each other, and each of the lens pattern area A1 and the non-pattern area A2 may be disposed at predetermined intervals T2.

The intervals T2 in which the lens pattern area A1 and the non-pattern area A2 are alternately or adjacently disposed, and respective widths of the lens pattern area A1 and the non-pattern area A2 may be based on a pixel arrangement of a display panel on which the optical film 4 is attached. As illustrated in FIG. 17, the optical film 4 may be attached on the organic light-emitting display panel OP. The organic light-emitting display panel OP includes light emission areas corresponding to a plurality of pixels (e.g., a red pixel R, a green pixel G, a blue pixel B) and non-emission areas between the light emission areas. The intervals T2 and the respective widths of the lens pattern area A1 and the non-pattern area A2 may be determined to allow the lens pattern area A1 to be disposed at a location facing an emission area and the non-pattern area A2 to be disposed at a location facing at least a portion of the non-emission area.

In such an embodiment, the non-pattern area A2 reduces the image distortion that may occur due to the lens pattern area A1. Accordingly, in such an embodiment, if a width S2 of the non-pattern area A2 is too large, color shift reduction by the optical film 4 may be relatively ineffective, and if the width S2 of the non-pattern area A2 is too small, image distortion may occur. Therefore, in an embodiment, widths of the S1 and S2 are predetermined to optimize color shift reduction and image distortion reduction. If S2/S1 decreases, image blur is reduced, but a degree of color shift improvement may also decrease. If S2/S1 increases, a degree of color shift improvement may increase (i.e., color shift is reduced), but image blur is also increased. An appropriate range of S2/S1 may be determined based on predetermined degrees of color shift improvement and image distortion.

Figure 18:
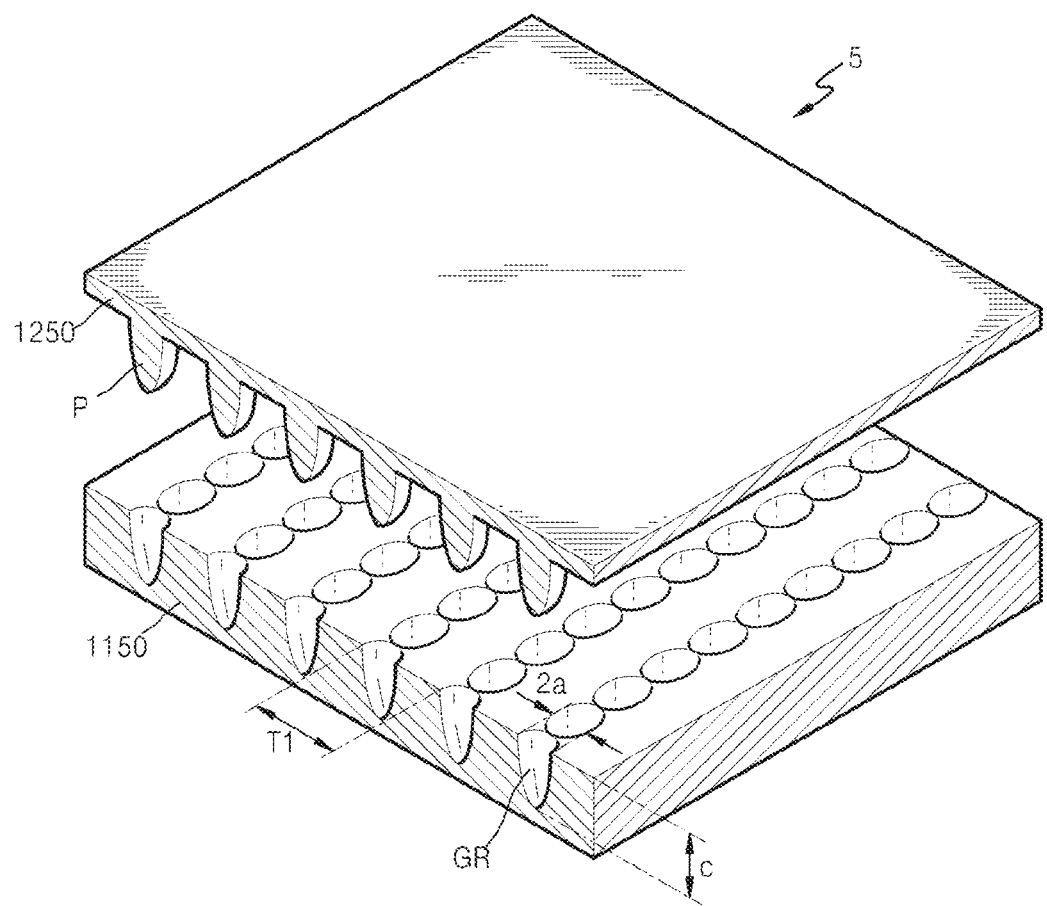
FIG. 18 is an exploded perspective view of another alternative embodiment of an optical film according to the invention.
Figure 19:
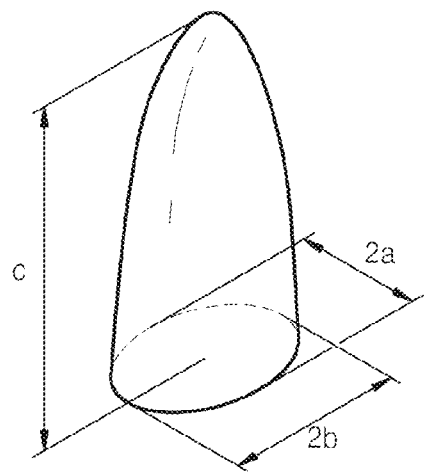
FIG. 19 is a perspective view of a protrusion of the optical film of FIG. 18.

FIG. 18 is an exploded perspective view of another alternative embodiment of an optical film 5 according to the invention. FIG. 19 is a perspective view of a protrusion P of the optical film 5 of FIG. 18.

The optical film 5 includes a high refractive index pattern layer 1150 including a pattern defined by a plurality of grooves GR, and a low refractive index pattern layer 1250 including protrusions P that correspond to the plurality of grooves GR. In an embodiment, the plurality of grooves GR may be 2-dimensionally arranged in two directions that are perpendicular to each other, and each of the plurality of grooves GR may have a dot shape. In an embodiment, as illustrated in FIG. 18, the plurality of grooves GR are arranged without intervals in one of the two directions, but are spaced apart from each other at the predetermined intervals T1 in the other direction. In one embodiment, for example, the optical film 5 of FIG. 15 includes the plurality of grooves GR, each having the dot shape and arranged without intervals in a direction corresponding to a length direction of the plurality of grooves GR of the optical film 1 having the stripe shape as shown in FIG. 13, and the plurality of grooves GR are separated or spaced apart from each other by the same intervals T1 in a direction perpendicular to the length direction. However, embodiments of the invention are not limited thereto. In an alternative embodiment, each of the protrusions P may have an oval shape as illustrated in FIG. 19. An aspect ratio "c/2a," a long axis length "2b," and a short axis length "2a" may be appropriately determined for each of the protrusions P to reduce color shift and image blurs as described above.

Table 4 is a computer simulation result of BWRs and color shift improvement rates according to various forms of the oval shape and pattern occupying ratios.

TABLE 4

|  | Δn | c/(2a) | b/a | Pattern Occupying Ratio (%) | BWR (%) | Color shift improvement rate (%) |
| --- | --- | --- | --- | --- | --- | --- |
| Case 3-1 | 0.16 | 2.4 | 1.2 | 20 | 3.14 | 37.31 |
| Case 3-2 | 0.16 | 2.4 | 1.2 | 35 | 6.55 | 58.67 |
| Case 3-3 | 0.16 | 2.4 | 1.2 | 50 | 16.89 | 72.72 |
| Case 3-4 | 0.16 | 2.4 | 1.6 | 20 | 3.68 | 41.1 |
| Case 3-5 | 0.16 | 2.4 | 1.6 | 35 | 6.14 | 65.32 |
| Case 3-6 | 0.16 | 2.4 | 1.6 | 50 | 24.65 | 75.07 |
| Case 3-7 | 0.16 | 2.4 | 2 | 20 | 4.14 | 44.36 |
| Case 3-8 | 0.16 | 2.4 | 2 | 35 | 8.4 | 63.83 |
| Case 3-9 | 0.16 | 2.4 | 2 | 50 | 32.61 | 75.08 |

In comparison to Tables 2 and 3 which show the computer simulation results of the optical film having the stripe pattern, Table 4 shows increased reduction in the BWRs and color shift improvement rates.

Therefore, in an embodiment, the BWRs may be effectively reduced by using a 2-dimensionally arranged dot patterns that are arranged without intervals in one direction.

Figure 20:
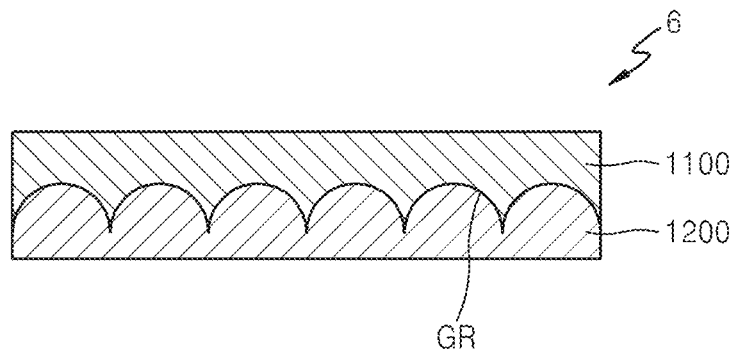
FIGS. 20 and 21 are cross-sectional views of alternative embodiments of an optical film according to the invention.
Figure 21:
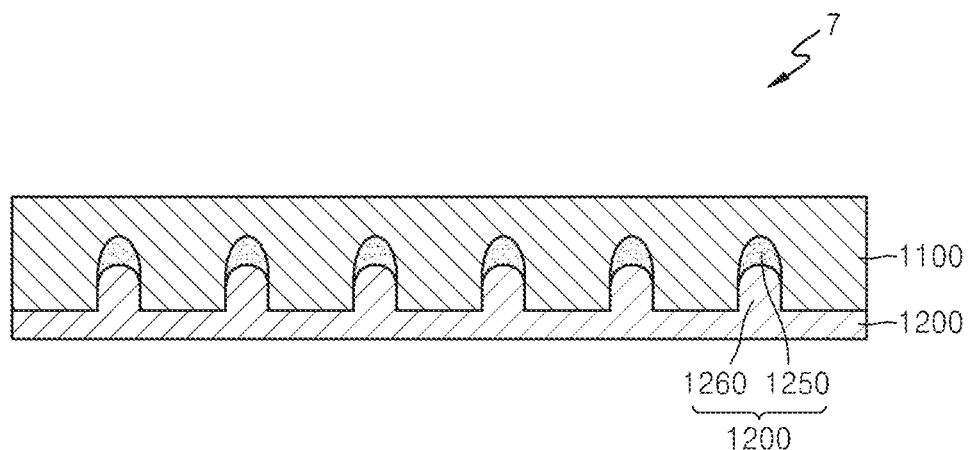

FIGS. 20 and 21 are cross-sectional views of alternative embodiments of an optical film 7 according to the invention.

As shown in FIG. 20, an embodiment of the optical film 6 includes the high refractive index pattern layer 1100 and the low refractive index pattern layer 1200. The high refractive index pattern layer 1100 includes a pattern defined by the plurality of grooves GR that are engraved on a surface thereof, and the low refractive index pattern layer 1200 includes protrusions corresponding to the plurality of grooves GR. In such an embodiment, the low refractive index pattern layer 1260 may include a plurality of layers having different refractive indexes as shown in FIG. 21.

In such an embodiment, where the low refractive index pattern layer 1200 includes the plurality of layers having different refractive indexes, an adhesive property between the low refractive index pattern layer 1200 and the high refractive index pattern layer 1100 may increase. In such an embodiment, color shift may be reduced based on refractive index difference between the low refractive index pattern layer 1200 and the high refractive index pattern layer 1100. In such an embodiment, when the refractive index difference is large, image blur may increase. Therefore, in such an embodiment, surface energy difference at a boundary surface is reduced by a gradual refractive index distribution, thereby increasing reliability and improving image blur.

In an embodiment, as shown in FIG. 21, the low refractive index pattern layer 1200 may include a first layer 1250 and a second layer 1260. However, the low refractive index pattern layer 1200 is not limited thereto, and the low refractive index pattern layer 1200 may include three or more layers.

Embodiments of the optical film 1 to 7 described above may further include an adhesive layer, a circular polarization film, or a transmittance adjusting layer, for example, when the optical films 1 to 7 are applied to the organic light-emitting display apparatus. Hereinafter, structures of various embodiments of the optical film to be applied to the organic light-emitting display apparatus will be described in detail.

Figure 22:
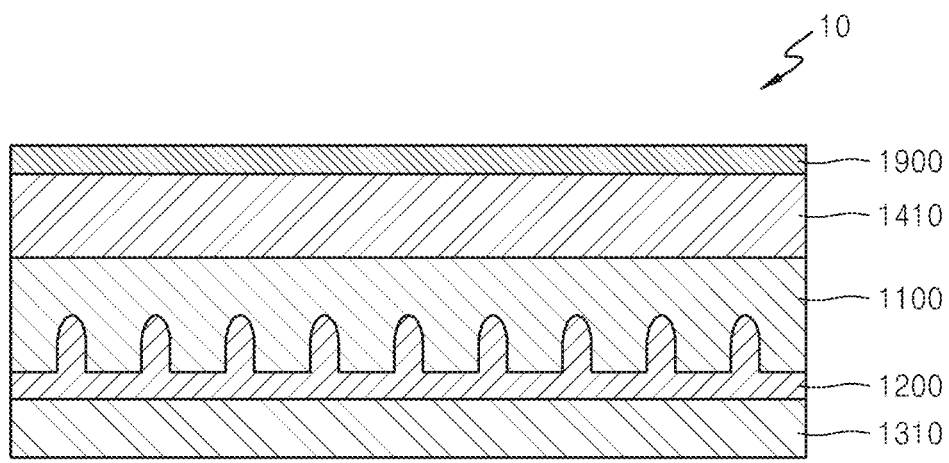
FIG. 22 is a cross-sectional view of another alternative embodiment of an optical film according to the invention.

FIG. 22 is a cross-sectional view of another embodiment of an optical film 10 according to the invention.

In an embodiment, the optical film 10 further includes an anti-reflection layer 1900 disposed on the high refractive index pattern layer 1100, a first adhesive layer 1310 disposed below the low refractive index pattern layer 1200, and a first base layer 1410 disposed between the high refractive index pattern layer 1100 and the anti-reflection layer 1900.

The first adhesive layer 1310, which is for attaching the optical film 10 to the organic light-emitting display panel, may include or be formed of a pressure sensitive adhesive ("PSA"), or a PSA including a light absorber or a light diffuser, for example. The high refractive index pattern layer 1100 and/or low refractive index pattern layer 1200 may include a transparent material including a light absorber. In an embodiment, where a material including a light absorber is included in various layers in the optical film, external light reflection may be effectively reduced, thereby increasing visibility.

The first base layer 1410 functions as a base substrate for forming the high refractive index pattern layer 1100 and the low refractive index pattern layer 1200 during a manufacturing process of the optical film 10, and may include or be formed of an optically isotropic material such as TAC.

Figure 23:
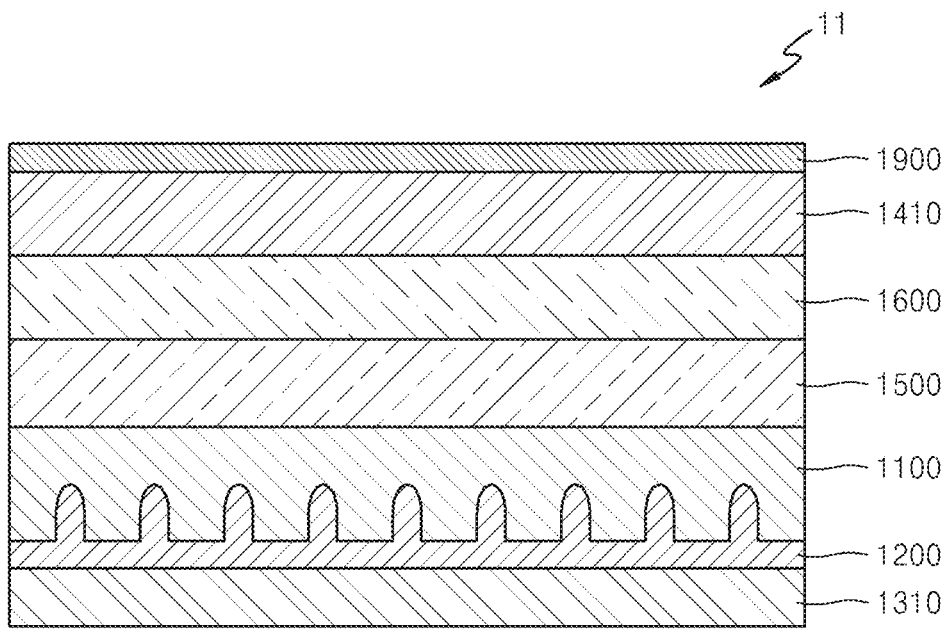
FIGS. 23 and 24 are cross-sectional views of embodiments of an optical film including a circular polarization film, according to the invention.
Figure 24:
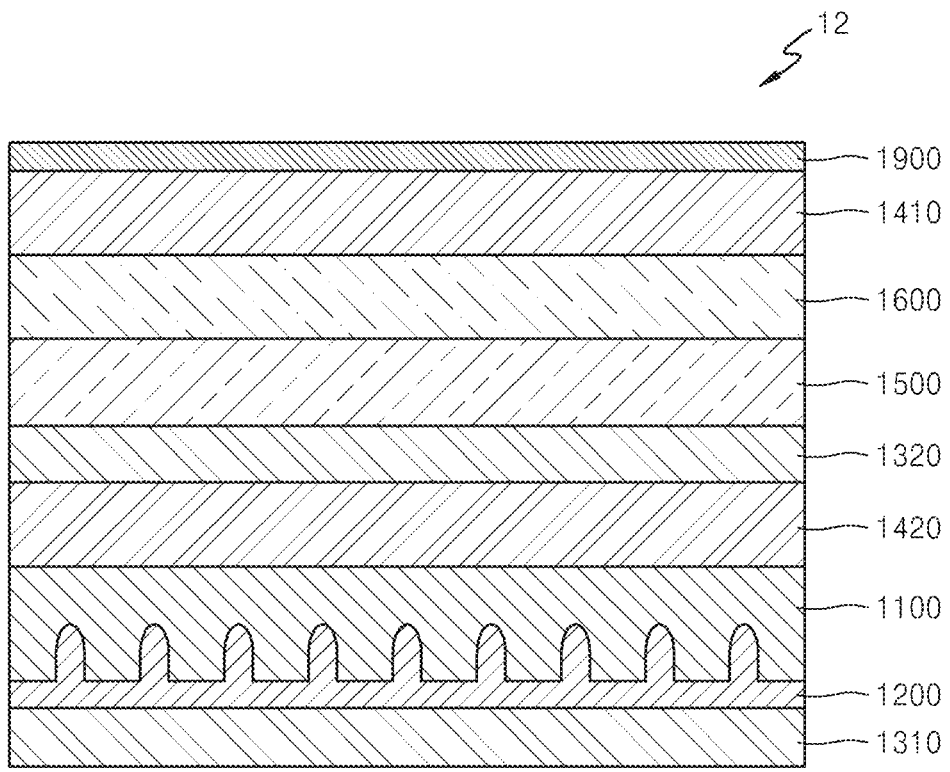

FIGS. 23 and 24 are cross-sectional views of embodiments of an optical film 11 and 12 including the circular polarization film, according to the invention.

In an embodiment of an optical film 11 or 12 including the circular polarization film, the circular polarization film may include a phase conversion layer 1500 and a linear polarization layer 1600. The phase conversion layer 1500 may be, for example, a λ/4 retardation film. The linear polarization layer 1600 may include a polyvinyl alcohol ("PVA") film, or may have a stacked structure including a TAC film or various other structures. The PVA film polarizes light and may further include a dichromatic pigment absorbed to PVA, which is a polymer material.

Referring to FIGS. 23 and 24, from the bottom to the top, an embodiment of the optical film 11 or 12 includes the first adhesive layer 1310, the low refractive index pattern layer 1200, the high refractive index pattern layer 1100, the phase conversion layer 1500, the linear polarization layer 1600, the first base 1410 and the anti-reflection layer 1900, which are sequentially stacked one on another or sequentially disposed from the bottom to the top thereof.

The circular polarization film including the phase conversion layer 1500 and the linear polarization layer 1600 reduces external light reflection to thereby increase visibility. When external light that is non-polarized is incident, the external light is changed to linear polarized light by passing through the linear polarization layer 1600 and is changed circularly polarized light by passing through the phase conversion layer 1500. The circularly polarized light passes through the high refractive index pattern layer 1100, the low refractive index pattern layer 1200 and the first adhesive layer 1310, and is reflected from an interface of an organic light-emitting display panel (not shown) that contacts the first adhesive layer 1310, and thereby the circularly polarization direction thereof is inversed or changed oppositely. Then, the inversed circularly polarized light is changed to linearly polarized light that is perpendicular to a transmission axis of the linear polarization layer 1600 by passing through the phase conversion layer 1500, thereby effectively prevented from being emitted to the outside.

As illustrated in FIGS. 23 and 24, in an embodiment where the circular polarization film is disposed on the high refractive index pattern layer 1100, if the high refractive index pattern layer 1100 is formed of an anisotropic material having an optical axis different from that of the circular polarization film, polarization may not be maintained, incident external light may be emitted to the outside again, a reflectance may be substantially increased, and thus visibility may be reduced. Therefore, in such an embodiment, the high refractive index pattern layer 1100 may include or be formed of an isotropic material having an optic axis that is the same as that of the circular polarization film, such as TAC or solvent casted polycarbonate ("PC").

In an alternative embodiment, as shown in FIG. 24, the optical film 12 may further include a second base layer 1420 and a second adhesive layer 1320 that are disposed between the high refractive index pattern layer 1100 and the phase conversion layer 1500, and are sequentially disposed from the high refractive index pattern layer 1100 toward the phase conversion layer 1500.

Figure 25:
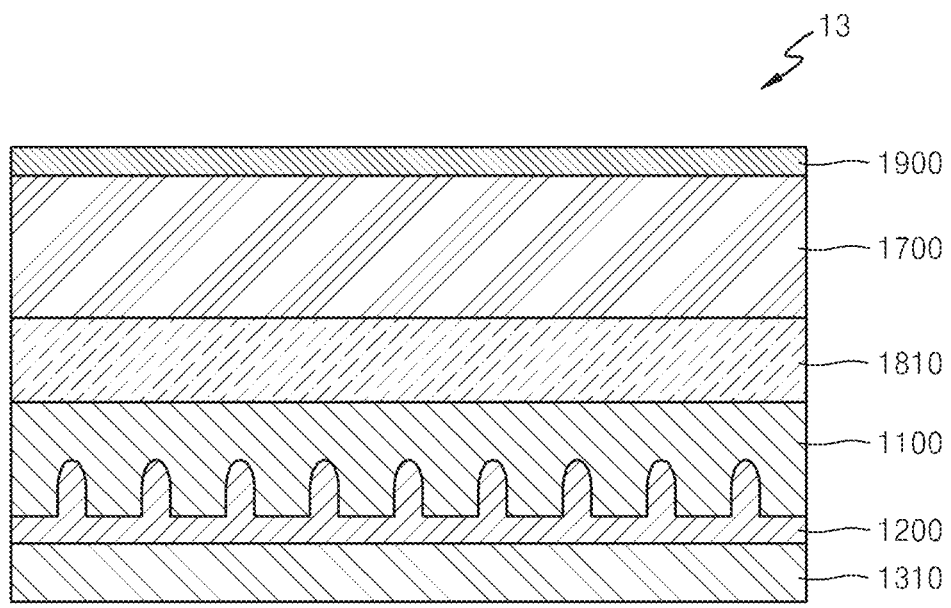
FIG. 25 is a cross-sectional view of an embodiment of an optical film including a transmittance adjusting layer, according to the invention.

FIG. 25 is a cross-sectional view of an embodiment of an optical film 13 including a transmittance adjusting layer 1700, according to the invention.

In such an embodiment, the transmittance adjusting layer 1700 may be a film formed by dispersing in polymer resin a light absorbing black material such as a black dye, a pigment, carbon black, or bridging particles on which a black dye, a pigment, or carbon black is coated. The polymer resin may be, but is not limited to, a binder such as polymethyl methacrylate ("PMMA"), or an acryl-based UV curing resin. A thickness of the transmittance adjusting layer 1700 or a content of black materials in the polymer resin may be determined based on optical properties of the black materials. A transmittance of the transmittance adjusting layer 1700 may be about 40% or above, which is slightly greater than a transmittance of the circular polarization film.

The transmittance adjusting layer 1700 supplements the circular polarization film which completely blocks external light but has a low transmittance.

In such an embodiment, the optical film 13 includes the first adhesive layer 1310, the low refractive index pattern layer 1200, the high refractive index pattern layer 1100, a first carrier film 1810, the transmittance adjusting layer 1700 and the anti-reflection layer 1900, which are sequentially stacked one on another or sequentially disposed from the bottom to the top thereof.

The first carrier film 1810 functions as a base substrate for forming the high refractive index pattern layer 1100 and the low refractive index pattern layer 1200 during a manufacturing process of the optical film 13, or as a base for forming the anti-reflection layer 1900 and the transmittance adjusting layer 1700. In such an embodiment, the optical film 13 may not include a linear polarization layer and may not need to maintain polarization, such that the optical film 13 may include any of various materials including TAC, PET and PC, for example.

In embodiments of the optical films 10 to 14 described above with reference to FIGS. 22 to 25, respective shapes of the high refractive index pattern layer 1100 and the low refractive index pattern layer 1200 are substantially the same as in the embodiments of the optical film 1 described above with reference to FIG. 13. However, the respective shapes are not limited thereto, and may be variously modified, e.g., may be changed to the shapes illustrated in FIGS. 14 to 21. Respective arrangement structures of the embodiments of the optical films 10 to 14 described above with reference to FIGS. 22 to 25 may be changed to various other arrangements. In one embodiment, for example, respective locations of the phase conversion layer 1500 and the linear polarization layer 1600 included in the circular polarization film may be changed, or another layer may be further disposed between the phase conversion layer 1500 and the linear polarization layer 1600. In an alternative embodiment, a second base layer and a second carrier film may be additionally included.

The embodiments of the optical film described above may be used in the organic light-emitting display apparatus. The organic light-emitting display apparatus may include an organic emission layer having a micro cavity structure configured to enhanced color purity, and color shift based on the viewing angles may be reduced, thereby providing a high-quality image with reduced image blur.

Figure 26:
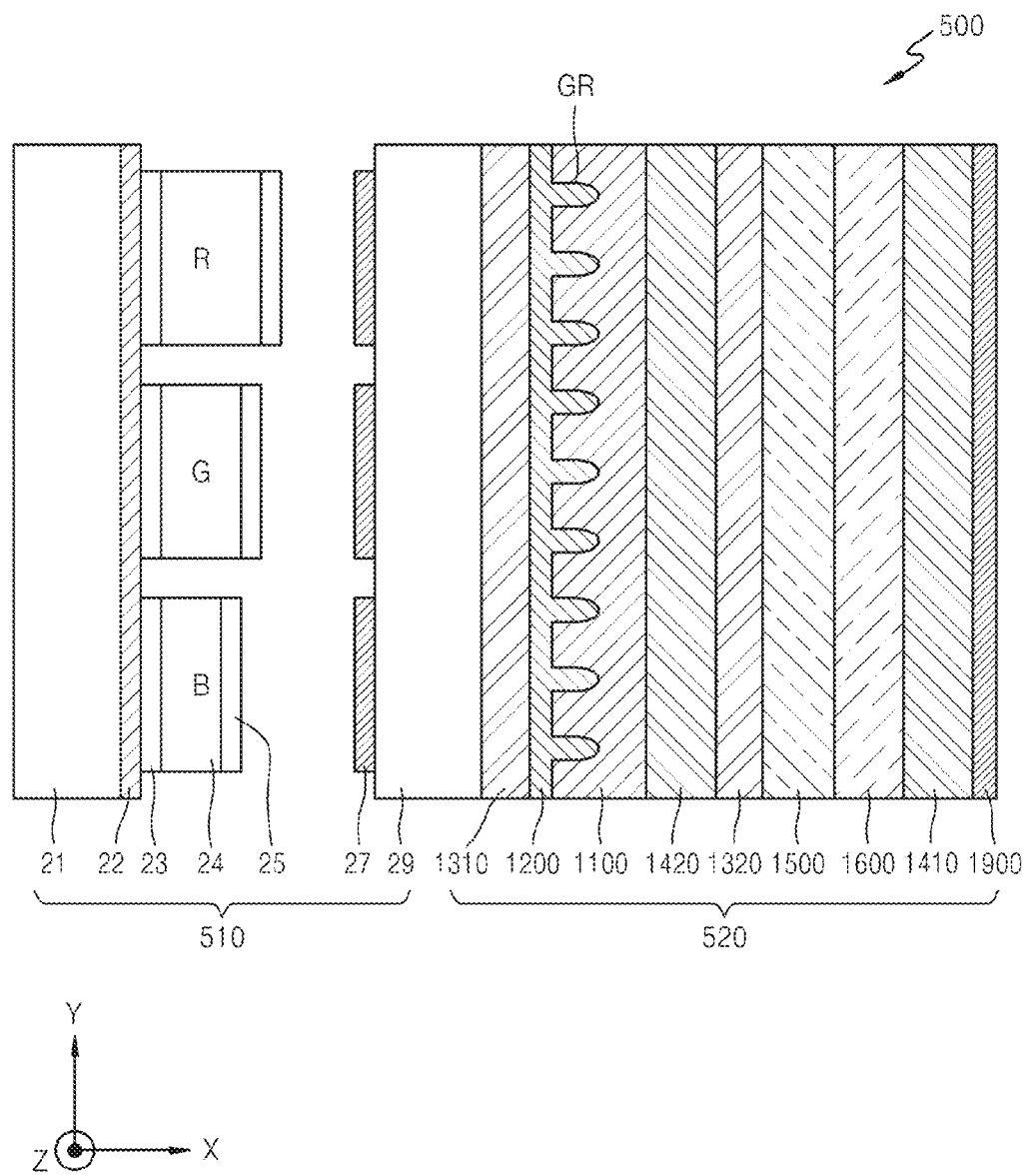
FIG. 26 is a cross-sectional view of an embodiment of an organic light-emitting display apparatus according to the invention.

FIG. 26 is a cross-sectional view of an embodiment of an organic light-emitting display apparatus 500 according to the invention.

In an embodiment, the organic light-emitting display apparatus 500 includes an organic light-emitting display panel 510, and an optical film 520 disposed on the organic light-emitting display panel 510. The organic light-emitting display panel 510 includes a plurality of pixels including organic emission layers that emit light having different wavelengths, and each of the organic emission layers includes a micro cavity structure that resonates light having corresponding wavelength.

In an embodiment, as shown in FIG. 26, the optical film 520 of the organic light-emitting display apparatus 500 may be substantially the same as the optical film 12 shown in FIG. 24. However, the optical film 520 of the organic light-emitting display apparatus 500 is not limited thereto, and other embodiments of the optical film as described herein may be used.

The organic light-emitting display panel 510 has a micro cavity structure to increase luminance and color purity. The organic light-emitting display panel 510 includes a plurality of OLEDs, each of which emits one of red (R), green (G) and blue (B) light, or white color light. Each OLED includes an anode 23, an organic emission layer 24 and a cathode 25. In an embodiment, as illustrated in FIG. 26, the organic light-emitting display panel 510 may include an OLED corresponding to a unit pixel which emits one of red (R), green (G) and blue (B) light, and have the micro cavity structure in which a distance between the anode 23 and the cathode 25 of a red OLED having a long wavelength is relatively the longest, and that a distance between the anode 23 and the cathode 25 of a blue OLED having a short wavelength is relatively the shortest. In such an embodiment of the organic light-emitting display panel 510, a distance between the anode 23 and the cathode 25 is set to correspond to respective representative wavelengths of R, G and B such that only light corresponding to the respective representative wavelengths is resonated and externally output while other light is weakened.

Hereinafter, detailed structure of an embodiment of the organic light-emitting display panel 510 will be described.

Each sub-pixel of the organic light-emitting display panel 510 may include the OLED that is disposed between a first substrate 21 and a second substrate 29 facing each other, where the OLED includes the anode 23, the organic emission layer 24 and the cathode 25, and a driver circuit unit 22 that is disposed on the first substrate 21 and is electrically connected to the anode 23 and the cathode 25.

In an embodiment, the anode 23 may include or be formed of an opaque metal such as aluminum (Al), and the cathode 25 may include or be formed of a transparent electrode such as indium tin oxide ("ITO") or a semitransparent electrode such as nickel (Ni) thin film such that light emitted from the organic emission layer 24 is transmitted.

The driver circuit unit 22 may include at least two thin film transistors ("TFT"s) (not shown) and a capacitor (not shown), and controls luminance of the OLED by controlling an amount of current supplied to the OLED based on data signals.

The driver circuit unit 22, which may be a circuit for driving unit pixels of the organic light-emitting display panel 510, may include a gate line, a data line vertically crossing the gate line, a switching TFT connected to the gate line and the data line, a driving TFT connected to the OLED and disposed between the switching TFT and a power line, and a storage capacitor connected between a gate electrode of the driving TFT and the power line.

In such an embodiment, the switching TFT responds to (e.g., is turned on or off based on) scan signals of the gate line, and thus supplies data signals of the data line to the gate electrode of the driving TFT and the storage capacitor. The driving TFT responds to the data signals from the switching TFT, controls current supplied to the OLED from the power line, and thus controls the luminance of the OLED. In such an embodiment, the storage capacitor stores the data signals from the switching TFT as stored voltages, and supplies stored voltages to the driving TFT such that the driving TFT may constantly supply current even when the switching TFT is turned off.

The organic emission layer 24 includes a hole injection layer ("HIL"), a hole transport layer ("HTL"), a light-emitting layer, an electron transport layer ("ETL"), and an electron injection layer ("EIL") that are sequentially stacked on the anode 23. When a forward voltage is applied between the anode 23 and the cathode 25, electrons move from the cathode 25 to the light-emitting layer through the EIL and the ETL, and holes move from the anode 23 to the light-emitting layer through the HIL and the HTL. The electrons and holes injected into the light-emitting layer L recombine in the light-emitting layer and generate excitons, and light is emitted as the excitons are shifted from an excited state to a ground state. A luminance of the emitted light is substantially proportional to an amount of current flowing between the anode 23 and the cathode 25.

The organic light-emitting display panel 510 may include a color filter 27 to increase color efficiency. The color filter 27 is disposed on the second substrate 29. In one embodiment, for example, a red color filter is disposed in a red sub-pixel area, a green color filter is disposed in a green sub-pixel area, and a blue color filter is disposed in a blue color filter area. In an embodiment, where a unit pixel is defined by 4 sub-pixels, e.g., 4 color sub-pixels (red, green, blue and white sub-pixels), the color filter 27 may be not included in a white sub-pixel area.

Although not illustrated, in an embodiment, a black matrix may be disposed on the second substrate 29 at a boundary of each sub-pixel to shield light and prevent mixing of colors.

In an organic light-emitting display apparatus having the micro cavity structure, maximum resonant wavelength becomes shorter, that is, color shift occurs toward the short wavelength, by a tilt in the viewing angle from the front to a lateral side. In such an organic light-emitting display apparatus, white light may be observed at the front, but a blue color shift in which bluish white light is observed may occur at the lateral side.

In an embodiment of the organic light-emitting display apparatus 500 according to the invention, the optical film 520 is disposed on the organic light-emitting display panel 510 to reduce color shift. In such an embodiment, the optical film 520 includes a lens pattern defined by the high refractive index pattern layer 1100 and the low refractive index pattern layer 1200 to reduce color shift. In such an embodiment, design details of the lens pattern may be determined to reduce image blur due to the lens pattern. In such an embodiment, the high refractive index pattern layer 1100 and the low refractive index pattern layer 1200 may be variously configured as described above with reference to FIGS. 13 to 20.

In such an embodiment, the high refractive index pattern layer 1100 and the low refractive index pattern layer 1200 receive light that is incident at a certain angle and emit light at various angles and function as color shift reducing layers. Light output from the organic light-emitting display panel 510 has a predetermined angle distribution at which light is emitted and has a color shift that varies according to the angle. After passing through the color shift-reducing layer including the high refractive index pattern layer 1100 and the low refractive index pattern layer 1200, light that is incident on the color shift-reducing layer at an angle that causes a substantial color shift and light that is incident on the color shift-reducing layer at an angle that causes a relatively less color shift are uniformly mixed and emitted, thereby reducing a color shift according to a viewer's viewing angle. The optical film 520 reduces color shift based on the viewing angles, but may also cause image distortions. Therefore, in an embodiment, a distance from the organic emission layer 24 to the optical film 520 may be set to be about 1.5 millimeters (mm) or less to reduce image distortions.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. An optical film comprising:
  a high refractive index pattern layer including a first surface and a second surface facing each other, wherein the first surface comprises a pattern including a plurality of grooves and the high refractive index pattern layer is formed of a material having a refractive index greater than 1; and
  a low refractive index pattern layer comprising a material having a refractive index less than the refractive index of the high refractive index pattern layer, wherein the low refractive index pattern layer comprises protrusions in matching shape to the plurality of grooves,
  wherein the optical film satisfies the following condition:

$$\frac{L_B - L_{B,0}}{L_{B,0}} < 0.7,$$

wherein $L_B$ denotes a blur width of a display panel including the optical film, and $L_{B,0}$ denotes the blur width of the display panel not including the optical film.

2. The optical film of claim 1, wherein
  each of the plurality of grooves has a stripe shape which extends in a predetermined direction, and
  the plurality of grooves is 1-dimensionally arranged.

3. The optical film of claim 2, wherein the material of the high refractive index pattern layer or the material of the low refractive index pattern layer comprises a transparent resin material and a light diffuser.

4. The optical film of claim 1, wherein a lens pattern area, in which the plurality of grooves is defined, and a non-pattern area are alternately disposed in the optical film.

5. The optical film of claim 4, wherein a width of the lens pattern area is greater than a width of the non-pattern area.

6. The optical film of claim 1, wherein
  each of the plurality of grooves has a dot shape, and
  the plurality of grooves is 2-dimensionally arranged.

7. The optical film of claim 6, wherein each of the plurality of grooves has an oval shape.

8. The optical film of claim 6, wherein the plurality of grooves are arranged without intervals in a first direction and are spaced apart from each other at predetermined intervals in a second direction, which is perpendicular to the first direction.

9. The optical film of claim 1, wherein the protrusions comprise a plurality of layers having different refractive indexes from each other.

10. The optical film of claim 1, further comprising:
  an anti-reflection layer disposed on the second surface of the high refractive index pattern layer, which is opposite to the first surface; and
  a circular polarization film or a transmittance adjusting layer disposed between the high refractive index pattern layer and the anti-reflection layer.

11. An organic light-emitting display apparatus comprising:
  an organic light-emitting display panel comprising a plurality of pixels comprising a plurality of organic emission layers, which emits light of different wavelengths, wherein each of the plurality of pixels has a micro cavity structure configured to resonates light corresponding to one of the different wavelengths; and
  the optical film of claim 1 disposed on the organic light-emitting display panel.

12. The optical film of claim 1, wherein the blur width of a display panel is evaluated by a method comprising:
  displaying a test pattern by driving an organic light-emitting display apparatus comprising the optical film;
  obtaining an image by capturing the test pattern using a digital camera;
  obtaining a spatial luminance distribution from the image;
  transforming the spatial luminance distribution into a sensation curve; and
  estimating a blur width from the sensation curve,
  wherein the blur width is a distance between peaks having minimum negative values, from among a plurality of peaks of the sensation curve.

13. The optical film of claim 12, wherein
  an x-axis of the sensation curve represents distance and a y-axis of the sensation curve represents sensation,
  the plurality of peaks of the sensation curve comprises a plurality of peaks in x-y coordinates,
  the blur width is a distance between two peaks having minimum negative y-coordinate values, from among peaks of the sensation curve in a region where the x-coordinates are negative and a region where the x-coordinates are positive.

14. The optical film of claim 12, wherein the test pattern is displayed on the optical film by a plurality of pixels disposed along a scanning line of a panel of the organic light-emitting display apparatus.

15. The optical film of claim 12, wherein the digital camera comprises a charge coupled device of the digital camera having a predetermined resolution which allows 30 or more charge coupled device pixels to cover one pixel of the organic light-emitting display apparatus.

16. The optical film of claim 12, wherein the spatial luminance distribution is estimated using a spectro-radiometer, and the spatial luminance distribution is transformed into the sensation curve using a Fourier transform and a numerical computation program.

17. The optical film of claim 16, wherein
  the spatial luminance distribution is transformed into a spatial frequency function using the Fourier transform, and is transformed into the sensation curve by multiplying a color sensitivity function by the spatial frequency function and using an inverse Fourier transform.

18. The optical film of claim 1, further comprising;
  a base layer;
  a high refractive optical diffusion layer disposed on the base layer.

19. A display apparatus including the optical film of claim 1.

* * * * *